United States Patent [19]

Hingorani et al.

[11] Patent Number: 4,821,290

[45] Date of Patent: Apr. 11, 1989

[54] DECODER FOR DIGITAL SIGNAL CODES

[75] Inventors: Rajesh Hingorani, Plainsboro; Nicola J. Fedele, Kingston, both of N.J.

[73] Assignee: General Electric Company, Schenectady, N.Y.

[21] Appl. No.: 237,631

[22] Filed: Aug. 26, 1988

Related U.S. Application Data

[63] Continuation of Ser. No. 158,171, Feb. 9, 1988, abandoned.

[51] Int. Cl.$^4$ .............................................. H04B 14/04
[52] U.S. Cl. ........................................ 375/25; 341/76; 375/27; 375/94
[58] Field of Search ...................... 375/25, 27, 34, 122, 375/94; 371/37, 38, 43, 51; 358/133, 138, 261.1; 381/31, 33; 329/109; 341/59, 67, 76, 95; 382/56

[56] References Cited

U.S. PATENT DOCUMENTS

| | | | |
|---|---|---|---|
| 3,860,908 | 1/1975 | Stratton, III | 371/51 |
| 4,118,773 | 10/1978 | Raguin et al. | 364/200 |
| 4,121,259 | 10/1978 | Preuss et al. | 358/261.1 |
| 4,298,987 | 11/1981 | Stattel et al. | 375/106 |
| 4,334,246 | 6/1982 | Saran | 358/261 |
| 4,404,680 | 9/1983 | Perkins | 375/111 |
| 4,549,305 | 10/1985 | Fushikida | 375/27 |
| 4,569,058 | 2/1986 | Grallert | 375/27 |
| 4,594,728 | 6/1986 | Niquel et al. | 375/116 |
| 4,616,211 | 10/1986 | Ross et al. | 340/347 DD |
| 4,654,853 | 3/1987 | Moriyama et al. | 371/37 |
| 4,701,746 | 10/1987 | Udea et al. | 340/347 DD |

*Primary Examiner*—Benedict V. Safourek
*Attorney, Agent, or Firm*—William Squire; James C. Davis, Jr.; Paul R. Webb, II

[57] ABSTRACT

A binary tree search system locates and outputs video data stored in a ROM, the data corresponding to received variable length uniquely encoded codewords. The data for each codeword is stored at a unique ROM address, each address corresponding to a tree leaf. Certain ROM locations not associated with complete codewords include a partial search address for the next search node, the remainder of the search address for each node comprising a bit of the serial received encoded data. When the received bits complete a codeword, the last received bit and the prior accessed ROM stored partial address form a pointer address to a tree leaf that accesses that ROM location containing the data corresponding to that codeword. Flags are generated by each accessed location to indicate whether or not a codeword has been found. If a codeword is found, the search is restarted at the tree root.

15 Claims, 4 Drawing Sheets

| ROM INPUT ADDRESS | | NODE | ROM | | | INFORMATION IN ROM FIELDS | OPERATION SEQUENCE |
|---|---|---|---|---|---|---|---|
| L | CODED INPUT BIT | | FIELD 1 NEXT L BIT ADDRESS | FIELD 2 SYMBOL | FIELD 3 FLAG | | |
| RESET { 000 | 0 | a | 001 | | 0 | ADDRESS 1 | CONTINUE |
| 000 | 1 | b | 010 | | 0 | ADDRESS 2 | CONTINUE |
| 001 | 0 | $\ell_1$ | | 000 | 1 | SYMBOL 0 | RESET |
| 001 | 1 | $\ell_2$ | | 001 | 1 | SYMBOL 1 | RESET |
| 010 | 0 | c | 011 | | 0 | ADDRESS 3 | CONTINUE |
| 010 | 1 | d | 100 | | 0 | ADDRESS 4 | CONTINUE |
| 011 | 0 | $\ell_3$ | | 010 | 1 | SYMBOL 2 | RESET |
| 011 | 1 | $\ell_4$ | | 011 | 1 | SYMBOL 3 | RESET |
| 100 | 0 | e | 101 | | 0 | ADDRESS 5 | CONTINUE |
| 100 | 1 | f | 110 | | 0 | ADDRESS 6 | CONTINUE |
| 101 | 0 | $\ell_5$ | | 100 | 1 | SYMBOL 4 | RESET |
| 101 | 1 | $\ell_6$ | | 101 | 1 | SYMBOL 5 | RESET |
| 110 | 0 | $\ell_7$ | | 110 | 1 | SYMBOL 6 | RESET |
| 110 | 1 | $\ell_8$ | | 111 | 1 | SYMBOL 7 | RESET |

Fig. 5

DECODER FOR DIGITAL SIGNAL CODES

This application is a continuation of application Ser. No 158,171, filed Feb. 19, 1988, now abandoned.

This invention relates to decoders for decoding digital signals in a communication system. Certain communication systems using digital signals include a number of signal processing functions. In the transmitter, such functions may include quantizers, predictive schemes and encoders for encoding digitized signals, buffers and control circuitry. The receiver may include buffers, a decoder and control circuitry among other functions. Sometimes the term "decoder" as used in this art refers to the receiver per se and at other times the term "decoder" refers merely to the decoding function of a decoder circuit within the receiver. The present invention relates to the latter.

Of interest is copending application Ser. No. 63,040 filed June 17, 1987 entitled "Parameterized Variable-length Coding" in the name of B. Astle and S. J. Golin, now abandoned, and copending application Ser. No. 127,335 filed Dec. 1, 1987 entitled "DPCM System with Adaptive Quantizer Having Unchanging Bin Number Ensemble" in the name of A. A. Acampora both assigned to RCA Corporation and Ser. No. 130,379 filed Dec. 8, 1987 entitled "Modified Statistical Coding of Digital Signals" in the name of N. J. Fedele and U.S. Pat. No. 4,706,260 assigned to the assignee of the present invention.

Where the bandwidth available in the transmission channel is limited, it is desirable to compress to as large extent as possible video data to be transmitted. Numerous schemes have evolved for increasing the efficiency of such compression during transmission while not introducing too intrusive reduction in image quality. For example, one kind of system known as differential pulse code modulation (DPCM) employs a predictive scheme for predicting pixel values of a video picture. The predicted information is compared to the actual information based on spatial or temporal relationships, and an error signal is generated representing the differences between the two information signals. The error signals are further reduced in information content by more coarsely quantizing them — that is, by classifying them into range bins. The coarser quantization is done so as to tend to make the range bin in which the lowest output value digital signals fall the one most frequently selected in the classification procedure and the range bins of successively higher output value digital signal ones less frequently selected than the ranges of lower values. The more coarsely quantized information is then encoded using codewords of variable bit length, which are chosen so their length is inversely related to the frequency that the bins they describe tend to be selected during the classification into range bins. This procedure is known as statistical coding.

Huffman has described procedures for describing variable length codes optimally. Further improvements in coding efficiency can be obtained by treating certain runs of successive bin values that are all alike differently from other bin values. Runs of certain length and value that are likely to occur can be classified as special cases and included in the statistical coding procedure, to be accorded short bit length codewords reflective of their tendency to frequently occur. This implies that signals having large run lengths may be converted to relatively short codewords which drastically increase the efficiency of the transmission system.

In information signals wherein a relatively large proportion of the information being transmitted is redundant and exhibits relatively little error from one block of information to a second block, the error signals tend to exhibit relatively long zero run lengths. By way of example, in a video signal transmitting picture information, a given 2.2 MHz image scan line has 240 active pixels. The resultant error signal in a predictive system thus can have zero run lengths of up to 240 consecutive zeros in a given scan line representing a still picture for that scan line and n non-zero levels outputted by the quantizer representing different degrees of motion. The result is a potential of over 240 different codewords being required to accurately represent the information signal. The problem is how to effectively deal with such numerous codes.

One solution to this problem is presented in U.S. Pat. No. 4,420,771 in which multiple tables are provided by run length encoding the information signal employing multiple dictionaries.

Another approach is to adaptively quantize the information prior to the coding process. However, the coarse quantizing process has a tendency, by definition, to reduce the information quality as compared to the original information signal. While the quantizer does increase efficiency, it tends to permanently eliminate information bits from the data signal which is generally to be avoided, if possible. A third approach to increasing transmission efficiency, i.e., provide increased compression, without detracting from the information signal quality and without employing excessively long codewords is disclosed in the aforementioned copending application Ser. No. 130,379. The latter is directed to a more efficient coder which can provide relatively high compression using codewords of minimum length as compared to the total number of different codewords employed.

At the receiver, the inverse process is used to reconstitute the original video data. This process includes a buffer to receive the transmitted data, a decoder to decode the encoded data and an inverse DPCM loop. Decoders are widely used but tend to be complex and costly. U.S. Pat. No. 4,569,058 issued to Grallert, for example, employs two code converters in the decoding system. One code converter is used for variable length DPCM codewords and a second converter is used for fixed length below-average length codewords. U.S. Pat. No. 4,334,246 issued to Rider et al. discloses a relatively complex system for decompressing video. U.S. Pat. No. 4,549,305 issued to Fushikide discloses a DPCM decoder which comprises two memory circuits for prestoring differential values and step size control codes. The use of multiple memories adds complexity and cost to the system.

According to the present invention, a decoder decodes a plurality of codewords of an information signal having a representative codeword comprising N bits. The codewords represent data. N is an integer and the bits occur in a given order. Memory means assign each bit of the codeword a memory location having an address based on the value and ordinal position of that bit in the codeword. A partial address is stored at each memory location for each except the last bit of the codeword. The partial address at each memory location has a value such that each except the last bit when combined with the value of the bit in the next occurring ordinal position of the codeword, forms a memory address to that memory location corresponding to the value of that next occurring bit. Data is stored at that memory location whose address corresponds to the partial address in memory for next to last bit combined with the value of the Nth received bit. The Nth bit memory location when addressed, produces data corresponding to the codeword at the memory means output.

Figure 1:
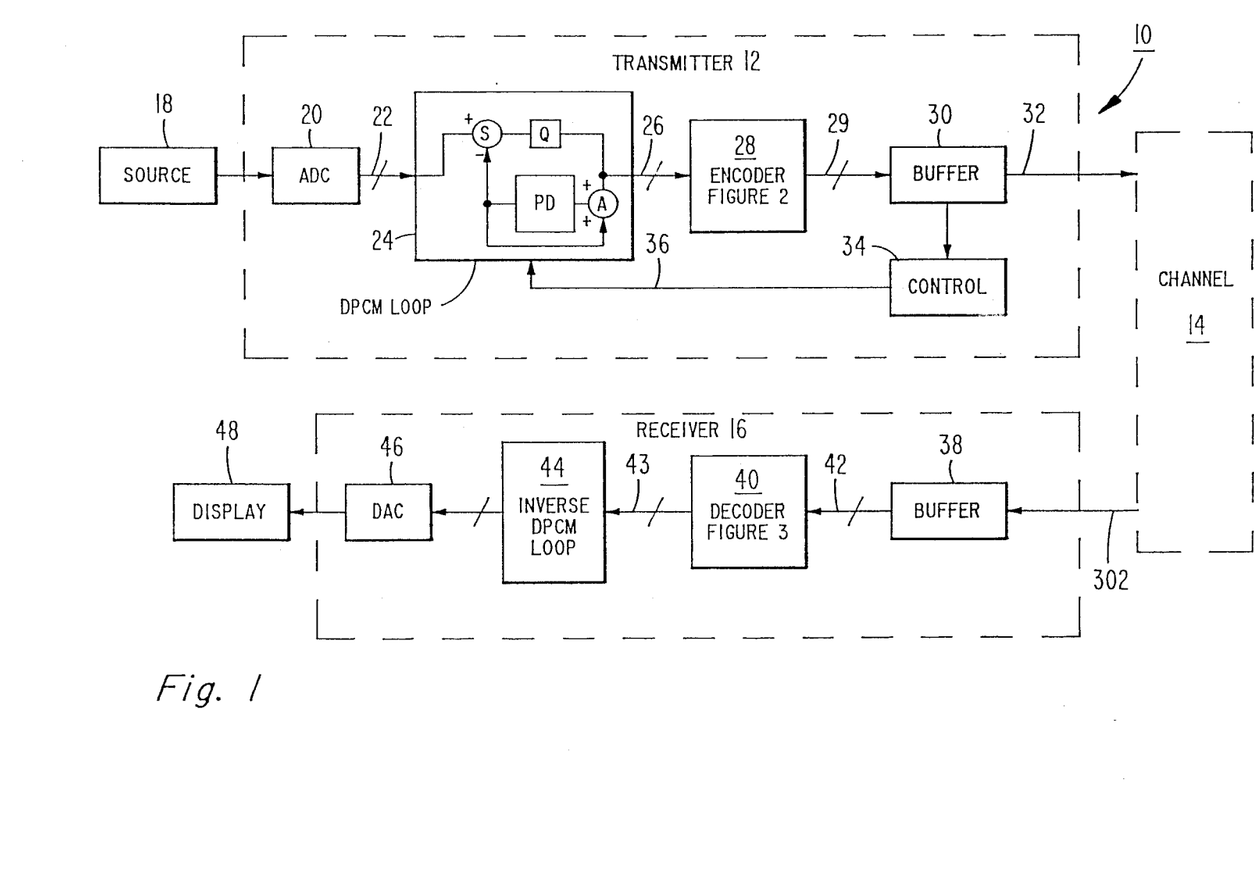
FIG. 1 is a block diagram of a transmission system employing a decoder according to one embodiment of the present invention.

In FIG. 1, system 10 comprises a transmitter 12, a channel 14 over which the transmitter 12 transmits and a receiver 16. By way of example, the transmitter 12 and receiver 16 are described as though the transmitter 12 is of the type including a predictive picture encoder employing differential pulse code modulation (DPCM). However, the signals may be derived from sources other than error signals in a predictive system.

In FIG. 1, a source 18 of information signals, for example video, applies the information to an analog-to-digital converter (ADC) 20 which finely quantizes the information signal in a known way to produce a multi-level digital signal. The output of the analog-to-digital converter (ADC) is applied on conductor 22 as an 8-bit pixel signal to a differential pulse code modulator (DPCM) loop 24. The DPCM loop 24 is one that is generally available and well known. It includes, for example, subtractor S for subtracting predicted information signals produced by a predictor and delay loop PD from the finely quanitzed information signal on conductor 22 to produce an error signal. That error signal is applied to a quantizer Q which assigns different values of the input error signal to a reduced number of output values or bins representing zero and non-zero values of the error signal. By way of example, the quantizer Q may have 32 bin values and a zero value, i.e., 32 non-zero values, for a total of 33 different values. The quantizer output values are applied to conductor 26 and adder A. Adder A adds the quantizer Q output signals to the predictor and delay loop PD output and applies the added signals to the predictor and delay loop PD.

Such a DPCM loop may be, for example, as described in U.S. Pat. No. 4,706,260 and in the aforementioned copending application entitled "DPCM System with Adaptive Quantizer Having Unchanging Bin Number Ensemble" in the name of A. A. Acampora, both of which describe prior art DPCM loops in greater detail.

It should be understood that wires representing conductors herein represent either single conductors or multiple conductors for transmitting data signals in parallel as known. The input information signal on conductor 22 to DPCM loop 24 may comprise, for example, an 8 conductor cable for carrying an 8-bit signal.

The output of the DPCM loop 24 is applied to conductor 26 and is an 8-bit signal which represents any of the 33 quantized zero and non-zero values of the information signal. The output of the DPCM loop 24 on conductor 26 is applied to encoder 28 which by way of example may be of the type described in the aforementioned application Ser. No. 130,379. In the alternative, encoder 28 may be of any conventional statistical type.

The encoder 28 encodes the output values of loop 24 to generate variable length codewords on conductor 29. The codewords are applied to a buffer 30 sometimes referred to as a rate buffer. The buffer 30 stores the codes for transmission over channel 14 via conductor 32. As known, the buffer 30 tends to overfill and underfill in response to the variable length codewords applied as an input thereto on conductor 29 and has a fixed output rate on conductor 32.

A control 34 senses the fill level of the buffer 30 and applies a control signal on conductor 36 to the DPCM loop 24 for controlling the coarseness of the quantizer Q of the loop 24. As described in the aforementioned U.S. Pat. No. 4,706,260 the quantizer Q may increase the number of zeros produced on conductor 26 i.e., widen the coring region, to reduce the data rate applied to buffer 30 in case of overfill. In case of underfill of the buffer, the control 34 applies a signal on conductor 36 to loop 24 to adaptively change the quantizer so as to increase the data rate to the buffer 30. As is known, the output of the buffer 30 on conductor 32 is at a constant data rate and information must be maintained on conductor 32 at that constant rate regardless of the rate at which buffer 30 fills. Some specific ways to meet this need are described in more detail, by way of example, in the aforementioned U.S. Pat. No. 4,706,260 and copending application Ser. No. 130,379.

The information on conductor 32 is transmitted via channel 14 to receiver 16 where the information signal is received by buffer 38. Decoder 40, described in more detail in FIG. 5, receives the output of buffer 38 on conductor 42 to decode the received information signal. The decoded signal is applied via conductor 43 to inverse DPCM loop 44. The output of loop 44 is applied via digitial-to-analog converter (DAC) 46 to a display monitor 48 which displays the information represented by the decoded information signal. While in the present embodiment, a coarsely quantized signal, having a representative few quantized levels, is employed, the present invention is not so limited and may be applied to any kind of digitized signal.

In processing video signals, it is characteristic of a system employing an interframe DPCM loop that the most frequently occurring quantized values represent unchanged or zero values. It is statistically known that for certain video frames, as for example, in teleconferencing systems, the majority of the frame information does not change from one frame to the next. Thus, in interframe DPCM where the predictor delays samples from the previous frame for a frame time are used to predict corresponding samples in the current frame, the resulting error signal tends to contain relatively long zero run lengths. The encoder 28, FIG. 1, assigns codeword lengths to the zero run lengths and non-zero values based on statistical frequency of occurrence. Statistically, it can be shown that runs of zeros of different lengths and non-zero values have different frequencies of occurrence. The non-zero values and the zero run-length values may be encoded with Huffman code methodology as described, for example, in copending application Ser. No. 130,379.

Generally, a Huffman code generates a set of codewords which satisfy a prefix condition. Such a set of codewords has the property that no codeword is the prefix of any other codeword belonging to the set. A code that satisfies this condition is referred to as a prefix condition code or prefix code. Similarly, a suffix condition code is one in which no codeword is the suffix of any other codeword. There can be a mirror relationship between a set of respective prefix codes and a set of respective suffix codes in that one set may be obtained from the other by simply reversing the bit order in each of the codewords of the original set. It can also be easily shown that any uniquely decodable code can be replaced by a prefix condition code without changing any of the codeword lengths.

The present invention is described in terms of a prefix code. However, this invention may be implemented with all uniquely decodable codes. Prefix condition codes themselves are a subset of the set of all uniquely decodable codes. To decode a sequence of codewords generated by a prefix condition code, start at the initial bit of the codeword and decode the codeword one bit at a time. The end of a codeword is uniquely determined since that codeword is not the prefix of another codeword.

Figure 4:
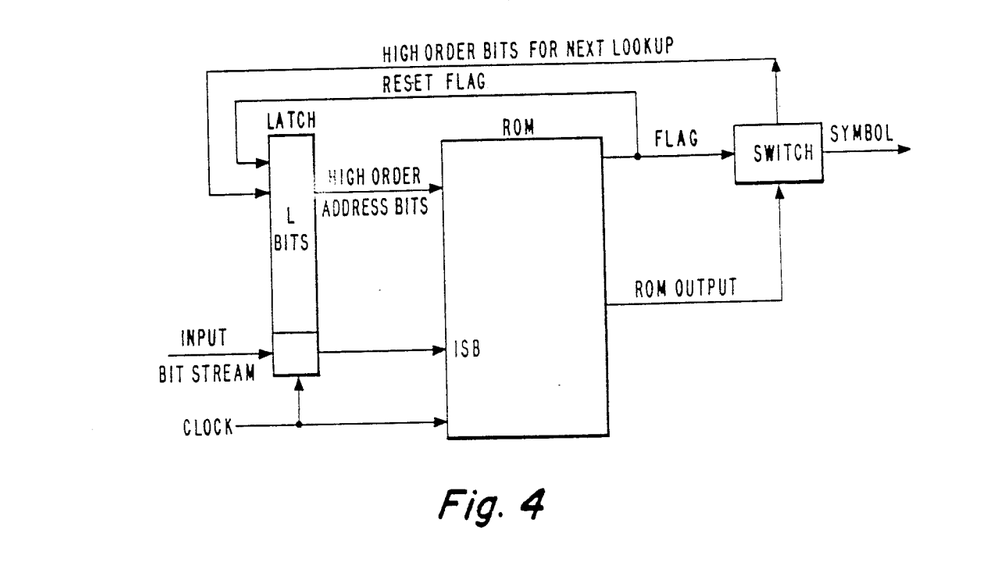
FIG. 4 is a block diagram useful in explaining the decoder of FIG. 1.

In FIG. 1, decoder 40 decodes the encoded signal received from buffer 38 via conductor 42. In FIG. 4, the approach of the decoder is to employ a ROM in which codewords and decoded data are stored in successively addressed ROM memory locations. Stored codewords are employed for run lengths and stored decoded data is used for decoding non-zero values. Each memory location includes a portion of the address of a successive memory location, the remaining portion comprising one bit from the received encoded input bit stream. Successive bits of the received signal are combined with corresponding successive address portions in memory to form a search address to a new memory location. A different codeword (for run length codes) or decoded codeword data (for amplitude codes), as applicable, is stored in memory at different given locations. Each location corresponds to a given sequence of binary values of the received encoded signal which in combination with that address portion relating to a given number of successive addresses in memory form a search address. When a complete codeword is received, the ROM outputs the corresponding run length codeword or decoded data stored at that address and the address to the ROM is reset to start a new codeword search with the next received encoded received bit.

More particularly, the decoder of the present invention is implemented with a binary tree search algorithm. This results in significantly increased efficiency in memory utilization and requires relatively little extra hardware. The tree search algorithm, as will be discussed in more detail below, uses a linked list binary bit tree representation with a unique addressing system such that the entire tree search logic can be easily stored in a ROM. A tree search algorithm avoids the need to divide the original set of received codewords, referred to hereinafter generally as symbols, into two groups as required by certain prior systems. Multiple groups were used because memory requirements generally grow exponentially with maximum codeword length. However, by employing Huffman encoding for all symbols in a combined group, for example as described in the aforementioned copending application Ser. No. 130,379, an increase in data rate is possible over prior systems in which symbols are artifically divided into multiple groups.

The code search tree generated in the Huffman code algorithm will now be discussed to illustrate the reduction in memory requirements of the tree decoder approach. Assume N symbols are to be coded. In the code tree, FIG. 2, these symbols occupy the terminal nodes (i.e. the leaves), forming N terminal nodes, $1_1$ through $1_n$. Each node of the tree - e.g., a' (root), the leaves and nodes a–f — has a corresponding ROM address. Each encoded received bit is combined sequentially one at a time in order of occurrence with a partial node address stored in the ROM creating a new node address to another ROM location represented by an intermediate node in the code tree. When a terminal node is reached, one less symbol remains. This process is repeated until all symbols are accessed. Thus a code tree generated by the algorithm has a total of $N+N-1$ or $2N-1$ nodes. The ROM required by such a tree decoder requires $2N-2$ locations each of which corresponds to a node in the code tree (the first or starting node can be addressed by external means and a separate memory location for its address is not needed). The size of each location is $L+1$ or $L+m$ bits, where m is the decoded codeword, L is the size of the partial address such that $2^L$ is N or more and the one bit is a flag. In FIG. 3, separate fields are shown for L and the symbol, for purposes of explanation. In practice, one field may accommodate either: (on the one hand) the $L+1$ bits or (on the other hand) the m bits of the symbol plus one bit indicating whether a codeword is absent or present at that location.

Figure 2:
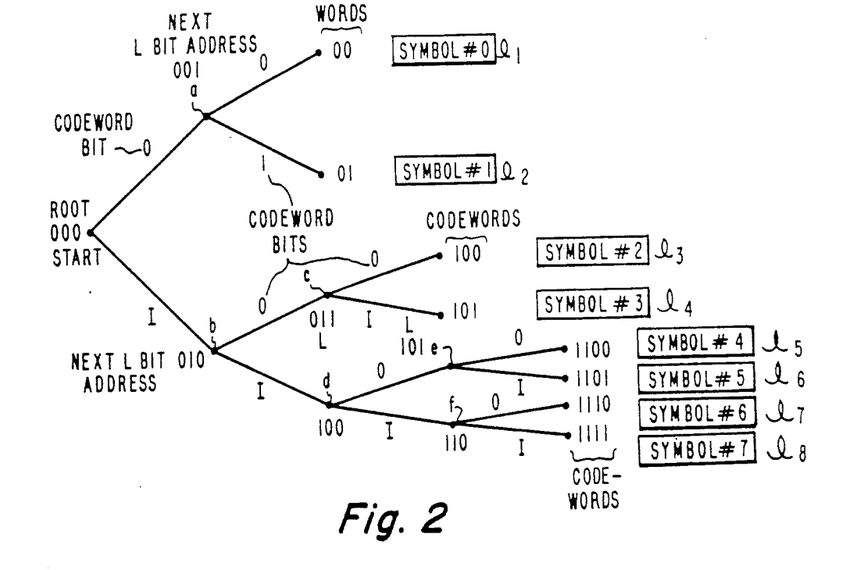
FIG. 2 is a diagram useful for explaining the principles of the present invention.
Figure 3:
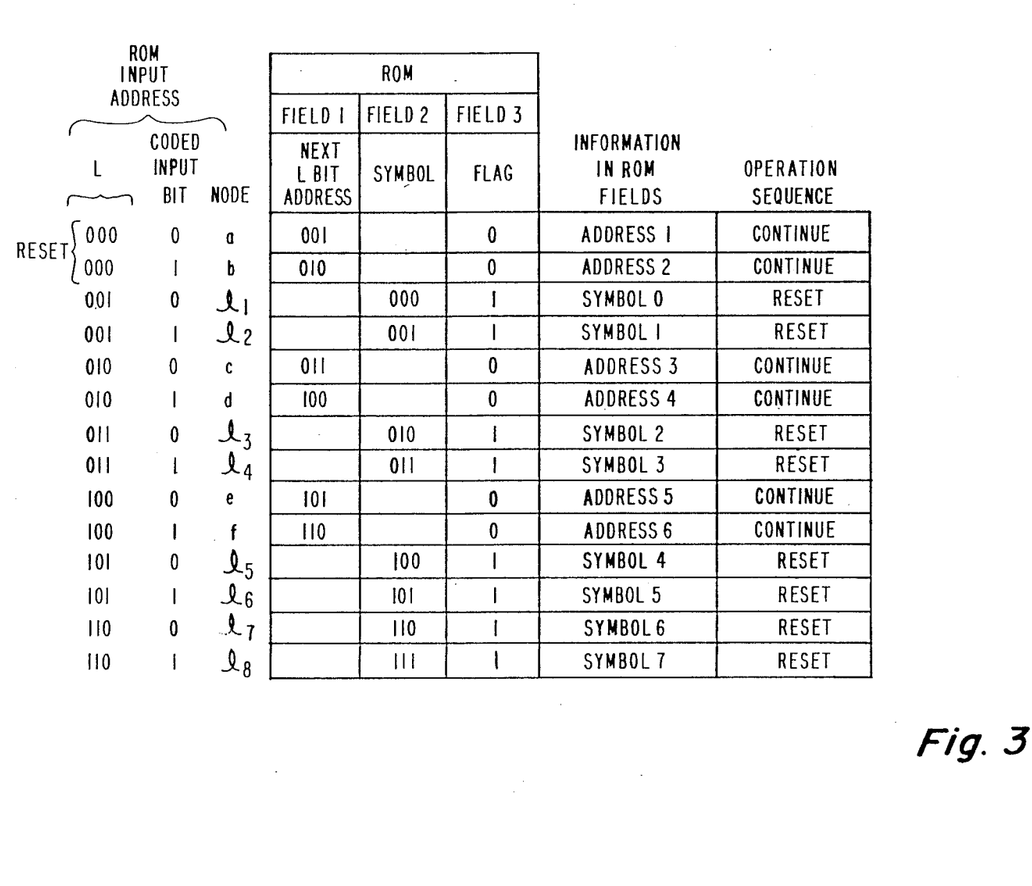
FIG. 3 is a table representing the contents of a ROM useful in explaining some of the principles of the present invention.

FIGS. 2 and 3 show an example of a code tree and the information stored in the corresponding ROM. This example corresponds to $N=8$ and $L=3$. There are $2N-1$ nodes in the code tree and there are $2N-2$ ROM locations. The ROM locations may consist of three fields. L partial address bits form the first field, the symbols form the second field and the third field contains single bit flags. (In the alternative, the first field may contain the symbols and other information, e.g. flags and so forth.) The first field forms the higher order L bits of an $L+1$ bit address which points to the location in the ROM of the next node in the code tree. The least significant bit of the address is obtained from the encoded input serial bit stream. The flag field is zero, to indicate no symbol has been decoded. $L+1$ bits are sufficient to uniquely address each of the ROM locations. When the flag field is a one, and this is true for the locations corresponding to the leaves of the code tree containing the symbols, the flag field in the ROM identifies that a symbol has been detected. The actual or decoded value of the symbol is placed into the symbol (or address) field for this address. Of course, the size of the symbol field is made to accommodate the length of the symbol values which, for example, in practice may be ten bits. A block diagram representation of the decoder is shown in FIG. 4.

In FIG. 4, if the flag bit is a zero, the L bits of the ROM at that location are applied to the latch via the switch (whose state is determined by the flag value). If the flag is one, the switch interrupts application of the ROM output to the latch input and the flag resets the latch to zero. The switch applies the decoded symbol to subsequent hardware for further processing.

The input bit stream of the encoded codewords are clocked into the latch at a fixed rate one bit at a time. Each bit of the encoded codewords forms the least significant bit (1sb) of the address which in combination with the high order address bits output of the latch form the complete address to the corresponding node of the tree. The latch outputs, i.e. the high order bits, are assumed to be zero at the start to form an initialization address. As the first codeword bit is received, a read operation is performed on the ROM using the address output of the latch in combination with the received bit. If the flag at this accessed address is a zero, an intermediate node in the code tree is accessed, e.g., node a FIG. 2. The L output bits, e.g., 001 at this address, denote the common higher order L bits of the address of the two branches from the current node represented by binary values zero and one. This higher order address is applied to the latch. At the next clock cycle when a new input bit arrives, the higher order address combines with the binary value of the next received codeword bit to address either leaf $1_1$ or $1_2$. At each clock cycle, as a new input bit arrives, the tree is passed one level further down until a terminal node is reached which is recognized because the flag becomes a one. At this time the output bits of the ROM at this location denote the decoded symbol. The flag resets the latch to the initialization address and the switch outputs the decoded information. The tree decoder requires one ROM lookup per input bit.

The function of the switch can be performed by ANDing the flag with each of the outputs of the ROM to apply the bits to the latch. At the same time, subsequent hardware can use the flag and the other ROM outputs to latch the decoded symbol whenever the flag is one. The advantage of this system is that arbitrarily long Huffman codes are accommodated if the underlying probability distribution so demands.

Figure 5:
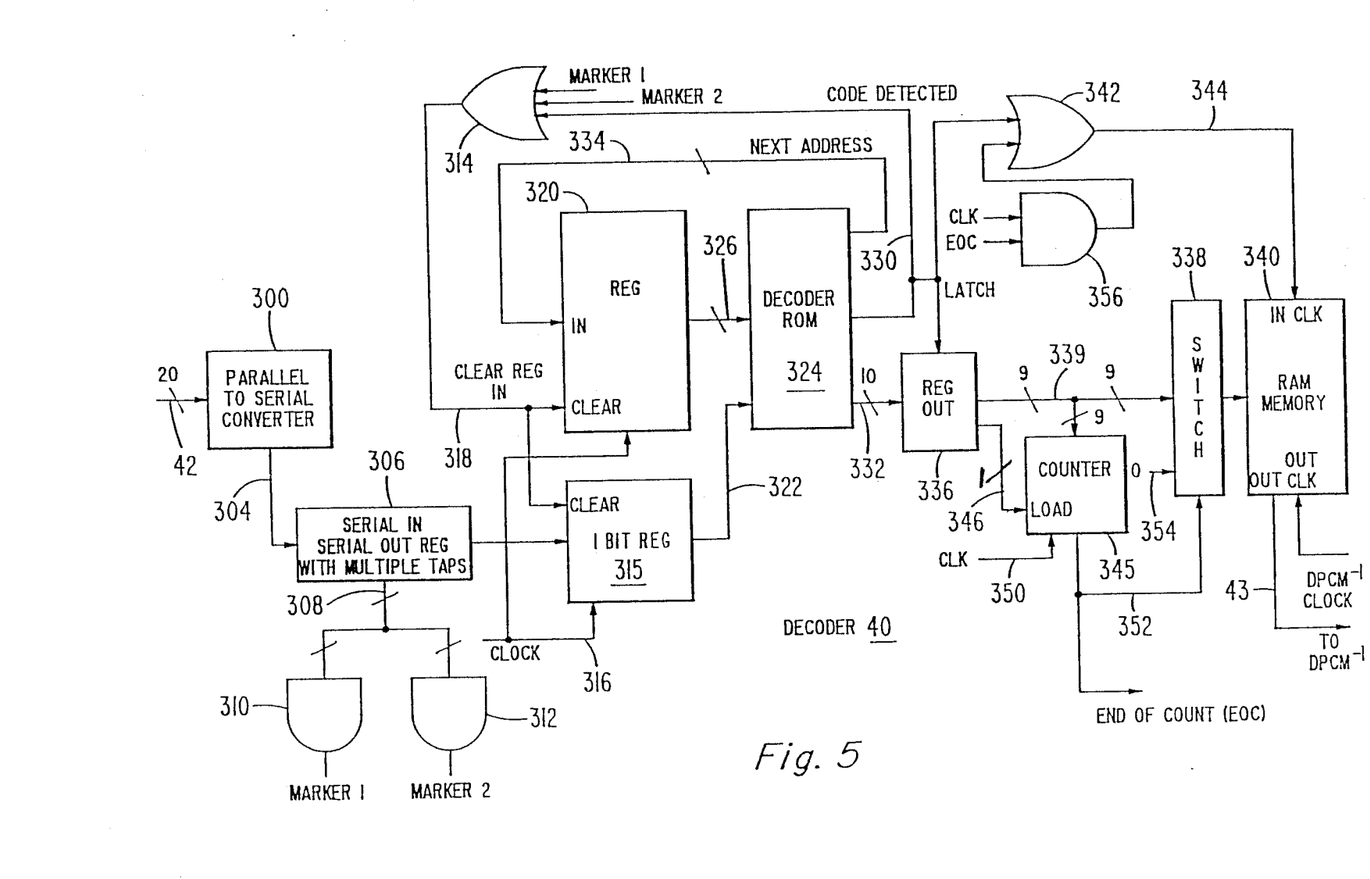
FIG. 5 is a block diagram of one implementation of the decoder employed in the embodiment of FIG. 1.

In FIG. 5, one implementation of decoder 40 is shown and includes a parallel-to-serial converter 300 which receives a 20-bit wide signal from buffer 38 on conductor 42. The parallel-to-serial converter 300 converts the parallel bits on conductor 42 to a serial stream on conductor 304 and applies the serial stream to a serial in/serial out register 306. Register 306 has multiple taps represented by a single conductor 308. The signal on conductor 308 is applied to AND gates 310 and 312 which detect the presence of marker 1 and marker 2. The marker 1 and marker 2 signals are applied to OR gate 314. The output of serial in/serial out register 306 is applied to register 315 which is a 1-bit register sometimes referred to as a flip-flop. Register 315 receives a clock signal from a clock source on conductor 316 and a clear signal on conductor 318. The clear signal on conductor 318, received from OR gate 314, is also applied to register 320. The output of register 315 is applied via conductor 322 to the decoder ROM 324. The output of register 320 is applied on conductor 326 to decoder ROM 324. The outputs of registers 315 and 320 together form the look-up address to ROM 324.

Register 320 is an n-bit register which in this example may be 9 bits which combines with the 1 bit from register 315 to form a 10-bit address to the ROM 324. Each address in the decoder ROM 324 contains three fields. One field represents the decoded data (the symbol in the dicsussion above) if a codeword is detected as represented by the information from registers 315 and 320. A second field is the next address code which contains the L bits forming a part of the address for the next segment of the ROM to be addressed. For example, if the first memory location in ROM 324 has an address of 000, the next memory location of the ROM 324 may have an address of 001 and the following memory location have an address 010, and so forth. These next addresses are binary incremented for each of the memory locations of the ROM. A third field located at each ROM 324 memory location contains the binary value flag representing the presence or absence of a decoded symbol at that address. If the data represented by the first field described above represents a complete received codeword, then the binary level of the flag in each ROM location will have a binary value representing the receipt of a complete codeword, for example, a binary one. If the data portion of the ROM location does not represent a complete received codeword, then the flag assigned to that ROM location has the opposite binary value —i.e., continuing the example, a binary zero. The ROM 324 at each memory location contains a sufficient number of bits to represent each of three fields as described.

Output bus conductor 334 of ROM 324 receives the next address information from the ROM memory. The conductor 330 receives the binary one codeword detection information bit flag (and binary zero no codeword detected bit flag). Output bus conductor 332 receives the data portion, i.e., the codeword one bit at a time. The conductor 330 receives the single-bit flag and conductor 332 receives an n-bit (preferably a ten-bit segment) representing the decoded information. The next address code applied to conductor 334 contains the address of the next memory location. I.e., the nodes of the tree as explained above, sequentially follow the initial memory location address in binary tree order as discussed. The address to the ROM on conductor 334 is completed by the single encoded data bit output of register 315 on conductor 322. That one bit is one of the sequentially occurring bits of a given received codeword processed by registers 306 and 315.

The data field portion of the ROM 324 contains two kinds of information. The first kind of information is a code which represents all non-zero code values. The second kind of information are the codewords representing binary counts of zeros in a zero run length. Not all ROM memory locations contain true data in the data portion of a given memory location. The data stored in the data portion are the data for the non-zero values, the zero run length codewords and the data for the marker 1, marker 2 and other codes, if any.

In operation of the decoder described so far, an encoded signal is converted to a serial stream of bits by converter 300 and is applied to serial in/serial out register 306 which applies the bits one bit at a time to register 315. A clock signal on conductor 316 clocks the contents of register 315 via conductor 322 to ROM 324 in conjunction with clocking the contents of register 320 to form the n-bit ROM address. A signal on conductor 330 is the code detected flag, which indicates whether or not a code has been detected. When any of the marker 1, marker 2 or code detected signals is high, a clear signal on conductor 318 is applied to register 320 which provides a zero address to ROM 324 to address the first memory location. The marker 1 and marker 2 signals are high when the code in register 306 represents one of the marker codes. Gates 310 and 312 test the outputs of register 306 for such marker codes.

If register 315 has a zero output on conductor 322, then the initial zero address of ROM 324 is addressed. Since the register 320 has been cleared and the register 315 has supplied only one bit from a codeword to the ROM 324 and assuming the minimum code length for one code is assumed to be two, no codeword will have been detected by this address. ROM 324 outputs a zero flag value on the code detected conductor 330 and will output on bus conductor 334 the address of the next sequentially stored memory location in ROM 324. This next address will be clocked into register 320. In conjunction with the output of register 315, a complete address is applied at the next clock to ROM 324 via conductor 316.

If the address comprising the bits on conductors 326 and 322 do not represent a received codeword, then the next addressed memory location in ROM 324 will output a lack of code detection flag signal on conductor 330, that is a binary zero value, and also a next address on bus conductor 334. Whether or not a code is detected is known a priori by the combination of a given address and the output of register 315. Depending on the nodes of the tree reached, a given memory address in combination with the known code bit output of register 315 can be determined to constitute a codeword. If that combination is known to form a codeword, then that input address will access the memory location containing the decoded codeword. Thus, a given number of cycles of next address in combination with a given output level from register 315 traverses the search tree and represents a decoded codeword. At the next clock signal on conductor 316, the next address on conductor 334 and the next bit in the encoded signal from register 306 are clocked to address ROM 324. If this combination of bits on conductors 326 and 322 represents a codeword (for example, a zero or non-zero value), then the ROM 324 will output a code detected signal, a binary one flag value on conductor 330. This binary one flag value clears register 320 and will output on bus conductor 332 the n-bit codeword representing that detected code value corresponding to that address.

That n-bit codeword on conductor 332 is applied to register 336. The n-bit codeword on conductor 332 includes an extra (n+1)th bit indicating whether a non-zero value or a zero run length value has been detected. Assuming a code is detected, the binary one code detected flag signal on conductor 330 is applied to register 336 to latch the n-bit data on conductor 332 from register 336 to output conductor 339. The extra (n+1)th bit is applied to conductor 346. The value of that extra bit applied to conductor 346 depends on whether a non-zero value or a zero run length value was detected. Assuming a non-zero value is detected, then the most significant bit of the code on conductor 332 is a one. This one is applied to conductor 346 and precludes loading the n-bits on conductor 339 into counter 345. The latch signal representing the code detected binary one value flag on conductor 330, however, latches the data on conductor 332 through register 336 to switch 338 via conductor 339. The data is latched into RAM memory 340 by the code detected flag signal on conductor 330 applied to the clock input of memory 340 via OR gate 342 and conductor 344. The data is clocked out of the memory 340 (FIG. 1) and applied via conductor 43 to loop 44 upon receipt of a DPCM loop clock pulse from DPCM loop 44.

If the most significant bit of the detected code on conductor 332 is a zero, a zero run length value has been detected. The data in ROM 324 represents, for zero run lengths, codewords which are the binary representation of the number of zeros in that run length. If a zero run length is detected, then the code detected signal on conductor 330 will latch the data from register 336 to conductor 339. The zero on conductor 346 loads the binary representation of the number of zeros in a given zero run length into the counter 345 from conductor 339. The clock signal on conductor 350 causes counter 345 to countdown the loaded binary count and applies a countdown signal on conductor 352 to switch 338 referred to as an end of clock signal which is a bilevel signal. The end of count (EOC) signal on conductor 352 is a binary one when the counter 340 counts and has a zero value when the counter is not counting. When the counter is not counting, this implies a non-zero value exists in register 336 and the signal on conductor 352 permits register 336 to output its contents via switch 338 into RAM 340. When a countdown signal EOC, e.g., a one is on conductor 352, switch 338 selects the zeros on conductor 354 and applies those zeros to memory 340. At this time, conductor 339 is disconnected from RAM 340.

In the meantime, the EOC signal enables gate 356 to apply clock pulses to memory 340 to clock into memory the zeros from switch 338. While the counter 345 is counting down the number of zeros in a given zero run length, the counter 345 cause the EOC output on conductor 352 and the clock pulses on conductor 344 zeros to be loaded into memory 340. When the counter 345 reaches the end of the count, the end of the count (EOC) signal applied on conductor 352 switches levels, e.g., goes low, and switches off the zeros from conductor 354. The end of count (EOC) signal is also applied to AND gate 356. When the counter 345 is not counting zeros and at the same time the bit on conductor 346 is a one, the low signal on conductor 352 places the switch 338 in a state to conduct the signals on conductor 339 to RAM 340.

AND gate 356 has a second input comprising a clock signal and upon receipt of the one end-of-count (EOC) signal from counter 345 applies clock pulses via OR gate 342 to memory 340 to input the zeros from switch 338, a zero being inputted on each clock pulse. The zeros are applied to the inverse DPCM loop via conductor 43 upon receipt by RAM 340 of a DPCM clock signal at the memory clock output port.

Whenever the next address on conductor 334 represents a lack of code being detected in ROM 324, the code detected flag signal on conductor 330 is zero and no latch signal is applied to register 336 or memory 340. In this way, register 336 is not latched and any information on conductor 332 is not applied to switch 338 or counter 345. If the next address location in ROM 324 also does not contain a code, the next bit in the serial input signal applied to one bit register 315 is added to the next address from ROM 324 to provide a new address to the next ROM location.

For example, if two zeros in a row are received from register 315 that may indicate a non-zero value codeword has been received. Those two zeros in combination with the sequence of next addresses appearing on conductor 334 cause the ROM memory location to output a value represented by the codeword 00 and indicate on conductor 330 a code has been detected. When the code is detected, a ten bit value on conductor 332 is outputted from ROM 324 representing the value of that detected codeword, that is the actual non-zero value with the extra bit indicating a non-zero value. Register 336 receives two groups of information from ROM 324: zero run lengths and non-zero values. Depending on the value of the bits applied to conductor 332 by ROM 324, the extra bit applied to register 336 represents whether or not a zero run length or a non-zero value has been detected as discussed above and that bit is supplied on conductor 346. That bit on conductor 346 determines whether the counter 345 should receive the encoded run length information from conductor 336 or not. If not, the counter 345 does not load the data on conductor 339 and switch 338 applies the latched data from register 336 directly to RAM 340.

What is claimed is:

1. A decoder for decoding a plurality of codewords of an information signal having a representative codeword comprising N bits where N is an integer, said bits occurring in a given order, said codewords representing data, said decoder comprising:

memory means for assigning each bit of said representative codeword a memory location having an address based on the value and ordinal position of that bit in the codeword, said means for assigning including means for storing a partial address at each memory location for each of except for the last bit of said codeword, the partial address at each said memory location having a value such that for each except the last bit of the codeword when combined with the value of the bit in the next occurring ordinal position of the codeword forms a memory address to that memory location corresponding to the value of that next occurring bit, said means for assigning including means for storing data at that location whose address corresponds to the partial address in memory for the next to last bit combined with the value of the Nth received bit; and means responsive to the addressing of said Nth bit memory location for producing said data corresponding to the representative codeword at an output of said memory means;

each said memory location including a flag field for generating a flag signal of first and second values, one value indicative of the generation of data and a second value indicative of the receipt of an incomplete codeword; and initial address generating means responsive to the generation of said flag signal of said first value indicative of the receipt of a codeword to form a partial initialization address which when combined with the next received codeword bit forms the address to a memory location for the first bit of that next occurring codeword.

2. The decoder of claim 1 wherein the memory location for the first occurring bit of said representative codeword has a partial initialization address which when combined with the value of the first occurring bit of the codeword forms the address to the memory location for that first occurring bit, said means responsive to the addressing of the Nth bit including means for generating said partial initialization address for decoding the next received codeword of said plurality of codewords.

3. The decoder of claim 1 wherein said initialization generating means includes a latch which resets in response to said flag signal indicative of the receipt of a codeword.

4. The decoder of claim 1 wherein said partial address comprises the most significant bits (msb) of the address to each location and the codeword bits form the least significant bit (lsb) of that address.

5. The decoder of claim 1 further including first and second latches, said first and second latches for producing an initialization address for that memory location corresponding to the first occurring bit of a codeword in response to the generation of said data and a third output latch responsive to the generation of said data for outputting said data therefrom.

6. The decoder of claim 1 wherein said data comprises run lengths comprising binary representations of the magnitude of the number of successively occurring values of a given amplitude and a plurality of amplitude values different than said given amplitude, said decoder including means responsive to the addressing of said data in said memory means for outputting the data corresponding to said amplitude values and for converting said run lengths into said successively occurring values and outputting said latter values.

7. The decoder of claim 6 wherein said decoder includes means for generating at least one signal indicating the generation of said data and whether the data is amplitude value or run length value, a register, switch means, a RAM and a counter, said register being responsive to said at least one signal for producing at a first output said data and at a second output a type signal manifesting whether the data is amplitude value or run length value, said counter being responsive to said type signal for generating a count signal representing the number of said given amplitudes, said switch means being responsive to said count signal for applying to said RAM either a series of signals manifesting said given run length value or said data amplitude values.

8. The decoder of claim 7 further including end of count (EOC) signal generating means responsive to said generation of said count signal to indicate the occurrence of a run length count and switch means responsive to said EOC signal to input the run length signals and amplitude value signals into said RAM.

9. A decoder for decoding a plurality of codewords of an information signal having a representative codeword comprising N bits where N is an integer, said bits occurring in a given order, said codewords representing data, said decoder comprising:

memory means for storing data corresponding to said plurality of said codewords each in a different corresponding plurality of first memory locations, each first location having a respective unique first address, said memory means for storing a plurality of second addresses in a corresponding plurality of second memory locations, each second location having a respective unique third address different than any of the first addresses and the third address of any other second location, said first, second and third addresses being related such that each codeword bit received in said given order when combined with the second address corresponding to the ordinal position of that bit in said given order forms a third address for each except the last bit of the codeword wherein the third address value is based on the ordinal position and value of each of the bits in the received codeword except the last, the last bit of said received codeword when combined with a corresponding second address forming a first address to thereby access the data corresponding to the codeword represented by said received N bits;

means responsive to the formation of each said first address for combining the next received bit after said last bit with an address portion to create a third address corresponding to a first received codeword bit; and means responsive to the formation of each said first address for creating an address portion;

said means for creating said address portion comprising a register having a reset input responsive to a reset signal for creating said address portion upon reset, said memory means including reset signal generating means for generating a reset signal in response to the addressing of said first address.

10. The decoder of claim 9 wherein said data stored in the memory means comprises a first set of data words corresponding to a first set of information signal input codewords and a second set of datawords corresponding to a second set of information signal input codewords, the second set of datawords comprising binary counts of run lengths of a given value; said decoder including means responsive to said second set of datawords to form run lengths of data having said given value.

11. The decoder of claim 10 wherein said means for decoding said second set of codewords includes adding a data bit of one value to each said first set of data words and a data bit of a second different value to said binary count of run lengths, and means responsive to said data bit of one value for storing said first set of datawords and means responsive to said data bit of a second value for converting said binary counts to run lengths of data of said given value and for storing said run lengths.

12. The decoder of claim 9 wherein said data comprises data words and run lengths codewords, said decoder further including an output register responsive to said reset signal for outputting said data words and codewords stored at said corresponding first locations, said codewords each including a tag bit for identifying said codewords as codewords and means responsive to said tag bit for decoding the run length codewords; said decoder including means for receiving the outputted data words and decoded run length codewords.

13. The decoder of claim 12 wherein said means for decoding the run length codewords comprises count means responsive to said tag bit for receiving said run length codewords and for counting the number of said given values in said run length codewords and means for generating said run lengths of said given value in response to said counting of the number of said given values.

14. A decoder for decoding a plurality of codewords of an information signal having a representative codeword comprising N bits where N is an integer, said bits occurring in a given order, said codeword representing data of different amplitude values and run lengths of a given value, said decoder comprising:
a ROM having a plurality of locations, each location having a different input address, a first set of said locations each containing data in a data field and a first flag bit in a flag field, said flag bit indicating data at that location, a second set of said locations each containing a partial ROM input address in an address field and a second flag bit in a flag field for indicating no data at that location,
the partial ROM input address being related to the ROM input address for that location such that the ordinal position of a codeword bit and its value in combination with a given partial address from a ROM input address point to a further ROM location, said further ROM location, if not containing data, has a partial address that when combined with the next occurring codeword bit forms a still further ROM location and so on until a flag bit is generated indicating data at that address location; and
latch means responsive to said first flag bit applied as an input thereto for addressing that ROM location corresponding to the next received codeword first bit and for generating at a ROM output the addressed data.

15. A decoder for decoding any set of information signal codewords respectively representing different values of said information signal, each codeword respectively comprising a number of bits arranged according to a prescribed bit place order N bits long although the number of bits in the codeword will be different than N for some codewords in the set, the ordinal placement of bits in a codeword being in accordance with said prescribed bit place order, said decoder comprising:
codeword analyzing means for analyzing each successive codeword in accordance with a binary search tree procedure through said set of information signal codewords, successive decisions in which binary search tree procedure are respectively controlled by the bits of said codeword conforming to said prescribed bit place order, said binary search tree having non terminal nodes at which respective decidions are made as to which subset of said information signal codewords the current analyzed codeword belongs, and said binary search tree having terminal nodes at which the identity of a codeword is established;
a memory included within said codeword analyzing means, said memory having a plurality of memory locations associated with respective nodes in said binary search tree, each said memory location having a respective unique address associated therewith, each memory location associated with a terminal node having stored therein the decoded value of said information signal associated with that codeword and means for describing the path of search through said binary search tree to said terminal node for the next occurring codeword, and each other memory location in said memory associated with a non terminal node having stored therein a partial address for two other memory locations associated respectively with the next nodes in alternate search paths through said binary search tree;
address generating means included within said codeword analyzing means, said address generating means being responsive to each of successive codewords in said set of information signal codewords for generating a respective sequence of read addresses for application to said memory, by combining the first bit of each said codewords with a prescribed value to generate an initial read address for the sequence of read addresses and by thereafter combining each successive bit of each said codeword with the partial address read from the previously addressed memory location to generate another successive read address for the sequence of read addresses;
means responding to the read addressing of a memory location containing said decoded value of said information signal for commanding said means for generating to begin the generation of new sequence of read addresses based on the succeeding codeword and for delivering said decoded value of said information signal as an output signal sample; and
flag signal generating means associated with said memory for generating a first signal manifesting the addressing of a terminal node and a second signal manifesting the addressing of a non terminal node.

* * * * *